US007270215B2

(12) United States Patent
Stiles

(10) Patent No.: US 7,270,215 B2
(45) Date of Patent: Sep. 18, 2007

(54) LOUDSPEAKER ENCLOSURE WITH DAMPING MATERIAL LAMINATED WITHIN INTERNAL SHEARING BRACE

(75) Inventor: Enrique M. Stiles, Imperial Beach, CA (US)

(73) Assignee: STEP Technologies Inc., Minneapolis, MN (US)

( * ) Notice: Subject to any disclaimer, the term of this patent is extended or adjusted under 35 U.S.C. 154(b) by 365 days.

(21) Appl. No.: 11/107,211

(22) Filed: Apr. 15, 2005

(65) Prior Publication Data

US 2006/0231327 A1 Oct. 19, 2006

(51) Int. Cl.

*H05K 5/02* (2006.01)
*A47B 81/06* (2006.01)
*H04R 1/28* (2006.01)
*H04R 1/20* (2006.01)
*H05K 5/00* (2006.01)
*H04R 1/02* (2006.01)

(52) U.S. Cl. ...................... 181/151; 181/199; 381/353; 381/354

(58) Field of Classification Search ................ 181/151, 181/146, 155, 156, 199, 148, 207–209; 381/345, 381/349, 353, 354, 162
See application file for complete search history.

(56) References Cited

U.S. PATENT DOCUMENTS 1,975,201 A * 10/1934 Elworthy .................... 181/155
1,985,881 A * 1/1935 Buckley ..................... 181/156
2,295,483 A * 9/1942 Knowles ..................... 381/404
2,476,572 A * 7/1949 Wenzel ....................... 181/148
2,805,729 A * 9/1957 Read .......................... 181/156
2,806,547 A * 9/1957 Sewell ....................... 181/156
2,840,181 A * 6/1958 Wildman .................... 181/199
2,866,514 A * 12/1958 Weathers .................... 181/151
2,986,228 A * 5/1961 Rettinger et al. ........... 181/199
3,104,730 A * 9/1963 Brown ....................... 181/199
3,138,220 A * 6/1964 Glindmeyer ................ 181/199
3,165,587 A * 1/1965 Alderson .................... 381/335
3,680,658 A * 8/1972 Goeskel ...................... 181/151
3,858,679 A * 1/1975 Askins ....................... 181/145
3,953,675 A * 4/1976 Babb .......................... 381/353

(Continued)

FOREIGN PATENT DOCUMENTS

DE 4141343 A1 * 5/1993

(Continued)

OTHER PUBLICATIONS

Art Ludwig, "Construction of the Loudspeakers" http://www.silcom.com/~aludwig/Loudspeaker_construction.html, no date provided.

(Continued)

*Primary Examiner*—Edgardo San Martin
(74) *Attorney, Agent, or Firm*—Richard C. Calderwood

(57) ABSTRACT

A loudspeaker cabinet with a laminated internal brace which has a first rigid layer coupled to a first exterior panel of the cabinet, a second rigid layer coupled to an a second exterior panel of the cabinet, and a damping layer affixed between the rigid layers where they overlap. Vibration, flexure, and expansion/contraction of the cabinet are damped by shearing forces applied to the damping layer as the rigid layers move in opposite, parallel directions.

33 Claims, 17 Drawing Sheets

U.S. PATENT DOCUMENTS

| | | | | | |
|---|---|---|---|---|---|
| 4,176,730 | A | * | 12/1979 | Mushkin | 181/148 |
| 4,232,762 | A | * | 11/1980 | Bschorr | 188/268 |
| 4,373,606 | A | * | 2/1983 | Clements et al. | 181/151 |
| 4,440,259 | A | * | 4/1984 | Strohbeen | 181/146 |
| 4,627,635 | A | * | 12/1986 | Koleda | 280/602 |
| 4,690,244 | A | * | 9/1987 | Dickie | 181/146 |
| 5,170,436 | A | * | 12/1992 | Powell | 381/338 |
| 5,240,221 | A | * | 8/1993 | Thomasen | 248/559 |
| 5,253,933 | A | * | 10/1993 | Walker | 312/351.7 |
| 5,550,335 | A | * | 8/1996 | Ermert et al. | 181/207 |
| 5,583,324 | A | * | 12/1996 | Thomasen | 181/199 |
| 5,602,367 | A | * | 2/1997 | Meyer | 181/156 |
| 5,629,503 | A | * | 5/1997 | Thomasen | 181/199 |
| 5,639,996 | A | * | 6/1997 | Tan | 181/199 |
| 5,691,516 | A | * | 11/1997 | Thomasen | 181/199 |
| 5,895,013 | A | * | 4/1999 | Towfiq | 244/119 |
| 5,949,033 | A | | 9/1999 | Anagnos | |
| 6,173,805 | B1 | * | 1/2001 | Thomasen | 181/207 |
| 6,205,229 | B1 | * | 3/2001 | Park | 381/388 |
| 6,279,679 | B1 | * | 8/2001 | Thomasen | 181/208 |
| 6,536,555 | B1 | * | 3/2003 | Kelsic et al. | 181/207 |
| 6,628,797 | B2 | * | 9/2003 | Yamada | 381/345 |
| RE39,330 | E | * | 10/2006 | Tozawa | 381/386 |
| 7,212,644 | B2 | * | 5/2007 | Gavriliu et al. | 381/353 |
| 2002/0036113 | A1 | * | 3/2002 | Chu | 181/199 |
| 2002/0114485 | A1 | * | 8/2002 | Ohira et al. | 381/386 |

FOREIGN PATENT DOCUMENTS

| | | | | |
|---|---|---|---|---|
| FR | 2618284 | A1 | * | 1/1989 |
| GB | 2149613 | A | * | 6/1985 |
| JP | 55025289 | A | * | 2/1980 |
| JP | 58133095 | A | * | 8/1983 |
| JP | 59158196 | A | * | 9/1984 |
| JP | 60043994 | A | * | 3/1985 |
| JP | 05344573 | A | * | 12/1993 |

OTHER PUBLICATIONS

DYNAMAT, "Dynamicd Control Specifications" http://www.dynamat.com/spec_pages.html Jan. 2004.

Leo Frank, "Bracing" http://bellsouthpwp.net/l/j/ljfrank/Bracing.html Oct. 2004.

http://www.snippets.org/pipermail/diyspeakers.not/2002-October/004865.html.

James Moriyasu, "Product Review: The Usher CP8871", audioXpress Feb. 2004.

Jim Moriyasu, "Panel Damping Studies: Methods of Reducing Loudspeaker Enclosure Vibrations, Part 1" audioXpress Feb. 2002.

* cited by examiner

LOUDSPEAKER ENCLOSURE WITH DAMPING MATERIAL LAMINATED WITHIN INTERNAL SHEARING BRACE

BACKGROUND OF THE INVENTION

1. Technical Field of the Invention

This invention relates generally to loudspeaker enclosures, and more specifically to location of damping material in loudspeaker enclosures.

2. Background Art

Acoustic transducers are known to cause vibration, flexure, expansion, contraction, and bending modes in the loudspeaker cabinets to which they are coupled. These effects can be directly caused by the physical coupling of the oscillating transducer to a panel of the cabinet—as the motor rapidly and powerfully extends and withdraws the diaphragm assembly, the non-moving transducer components and the cabinet structures to which they are coupled under go an equal-and-opposite reaction type of mechanically induced movement. Furthermore, the oscillation of the diaphragm assembly causes pressurization and rarefaction of the air volume within the cabinet, especially in a sealed cabinet. Low frequency vibrations can cause gross flexure of the cabinet panels, and even the higher frequency vibrations can cause partial flexure or higher order flexure of the panels.

It is desirable to minimize these vibrations, flexures, etc., as they can interfere with ideal operation of the loudspeaker. They can cause output loss, reducing acoustic output above and below flexure resonance. At a panel's resonant frequency and its harmonics, modes of destructive interference between the enclosure and the transducer cancel some amount of acoustic output of the transducer, and modes of constructive interference add and create higher output spikes in the acoustic output.

Various damping materials have been added to loudspeaker cabinets in attempts to reduce such vibration, expansion, and flexing. Some manufacturers have simply laminated a damping material layer onto the interior surfaces of their cabinets; this is known as extensional damping. Others have sandwiched or laminated damping materials between two or more layers of the cabinet panels or walls; this is known as constrained layer damping. Extensional damping and constrained layer damping are designed to absorb vibrations in the panel structures themselves, and are somewhat in contrast to the practice of placing acoustical batting against the panels to absorb vibrations in the enclosed air itself.

Damping materials function by converting the kinetic energy of the moving panels into heat. Previous configurations have not been especially effective in doing so. Very little compression and expansion of the damping material is induced by the vibration, and very little shear is applied to the damping material because of the geometries of the cabinet panels. When a panel flexes, the extensional or constrained damping layer coupled to it undergoes a very small degree of compression or expansion caused by the change in its curvature. It is very inefficient, geometrically, because the induced shear, compression, and expansion are nearly perpendicular to the direction of the panel motion.

Internal bracing is often added to loudspeaker cabinets, to reduce expansion and flexure of the cabinets. Internal braces can divide the cabinet's enclosed air into two or more separate, isolated volumes, if desired. Or, if the internal braces are small enough (meaning that they do not extend completely over the cross-sectional area of the air volume) or are provided with holes, the enclosed air remains a single effective air volume. Internal bracing stiffens the cabinet, shifting the panels' resonance to higher frequencies, but does not change the amount of damping of the enclosure. It changes the frequency but not the amplitude of the vibrational resonance.

What is needed is an improved loudspeaker cabinet with both improved damping and improved structural rigidity.

DETAILED DESCRIPTION

The invention will be understood more fully from the detailed description given below and from the accompanying drawings of embodiments of the invention which, however, should not be taken to limit the invention to the specific embodiments described, but are for explanation and understanding only.

Figure 1:
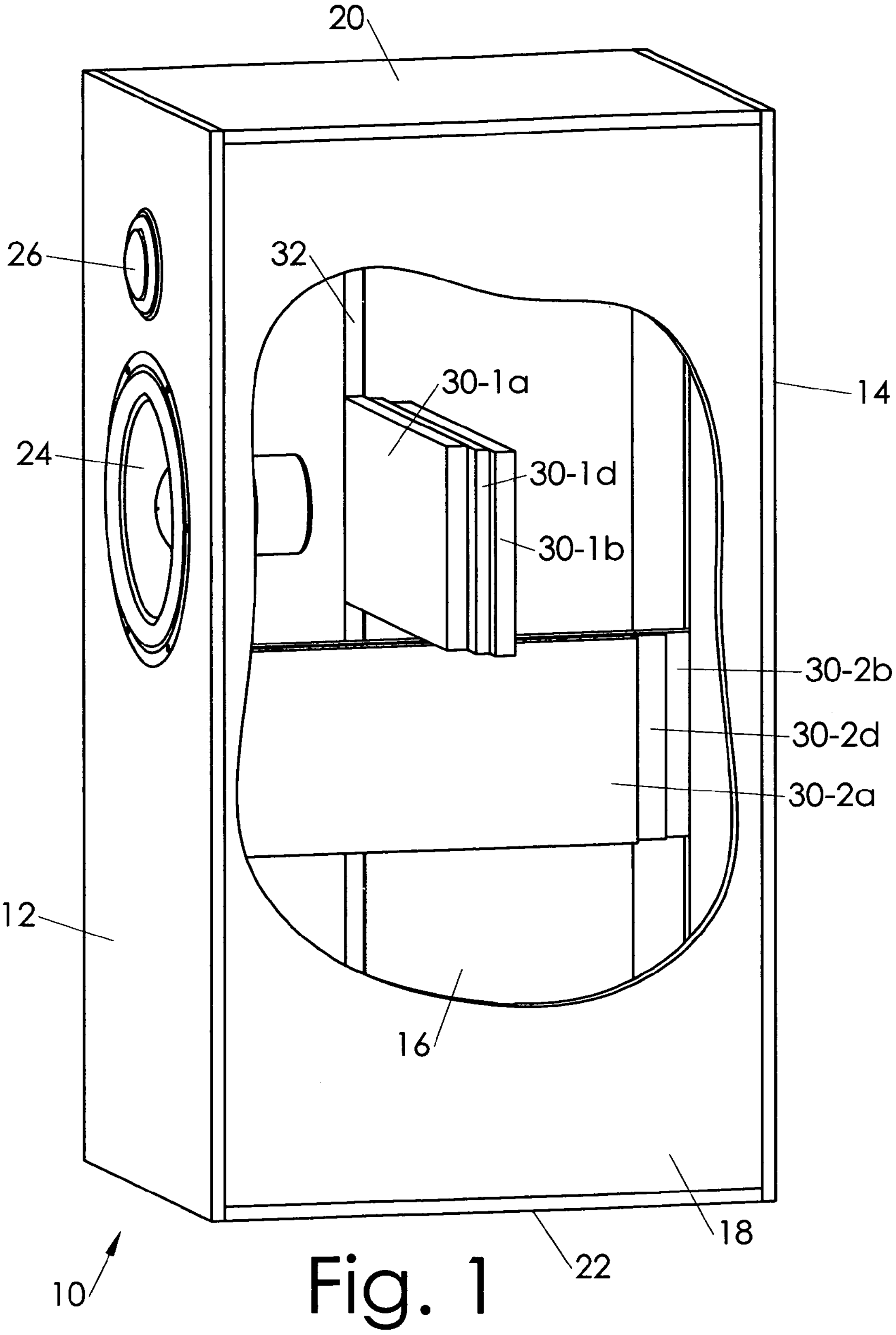
FIG. 1 shows a loudspeaker cabinet according to one embodiment of this invention, with a cutaway providing visibility into the internal structures of the cabinet.

FIG. 1 illustrates a loudspeaker cabinet 10 according to a first embodiment of this invention. The cabinet includes a front panel 12, a rear panel 14, a left side panel 16, a right side panel 18 (shown with a cutaway for visibility inside the cabinet), a top panel 20, and a bottom panel 22, each of which may be termed an exterior panel, whether or not directly exposed to the external listening space. (Any of the exterior panels may be a laminated panel, and may include one or more sandwiched layers of damping material.) One or more of the panels, typically the front panel, are provided with one or more acoustical transducers 24 (typically of the electromagnetic variety), each of which includes a diaphragm whose front surface is exposed to the listening space and whose rear surface is exposed to the air enclosed within the cabinet. One or more of the panels may also be provided with one or more electromagnetic transducers 26 whose diaphragms are not in contact with the enclosed air volume, such as a self-enclosed tweeter as shown, or such as a midrange driver (not shown) which is coupled into a separate air volume.

The cabinet includes one or more shearing braces 30. In the embodiment shown, a first shearing brace 30-1 is coupled between the left and right side panels, and a second shearing brace 30-2 is coupled between the front and rear panels. The first internal brace includes a first brace member 30-1*a* which is coupled to the left panel, a second brace member 30-1*b* which is coupled to the right panel, and a layer of damping material 30-1*d* which is sandwiched between the first and second brace members. The first and second brace members overlap each other, but neither is coupled to the exterior panel to which the other is coupled. The damping layer is preferably, but not necessarily, affixed to both brace members, such as by adhesive. In some embodiments, the damping material may itself be an adhesive, rather than e.g. a dry layer of material separately adhered to the brace panels. Examples of suitable damping adhesives may include polyvinyl acetate, Armstrong flooring adhesive, E6000, North Creek soft glue, bookbinding glue, and other flexible glues.

Preferably, but not necessarily, the two brace members are coupled to opposing exterior panels. As shown, the brace members may simply be constructed from the same panel material as the exterior panels.

Because the two halves of the internal brace are coupled to two different exterior panels, when either exterior panel flexes or otherwise moves toward or away from the other exterior panel, the internal brace's damping layer is subjected to shearing forces which are almost exactly parallel to the surface of the damping layer. The more normal to this movement the brace can be placed, the more efficient the shearing movement will be.

Another significant improvement results from the fact that the entire body of the damping is subjected to shear. Furthermore, the entire body of the damping material can be subjected to shear-induced displacement which is approximately equal to the maximum distance moved by the respective walls (assuming careful placement of the brace). By way of contrast, the constrained layer damping in the prior art undergoes very little shear, even at the middle of the panels, and essentially zero near the edges.

The internal brace members are coupled to their respective exterior panels by any suitable means. For example, the panels may be held in grooves 32 cut into the internal surfaces of the exterior panels, and may be affixed with adhesive and/or screws (not shown).

Figure 2:
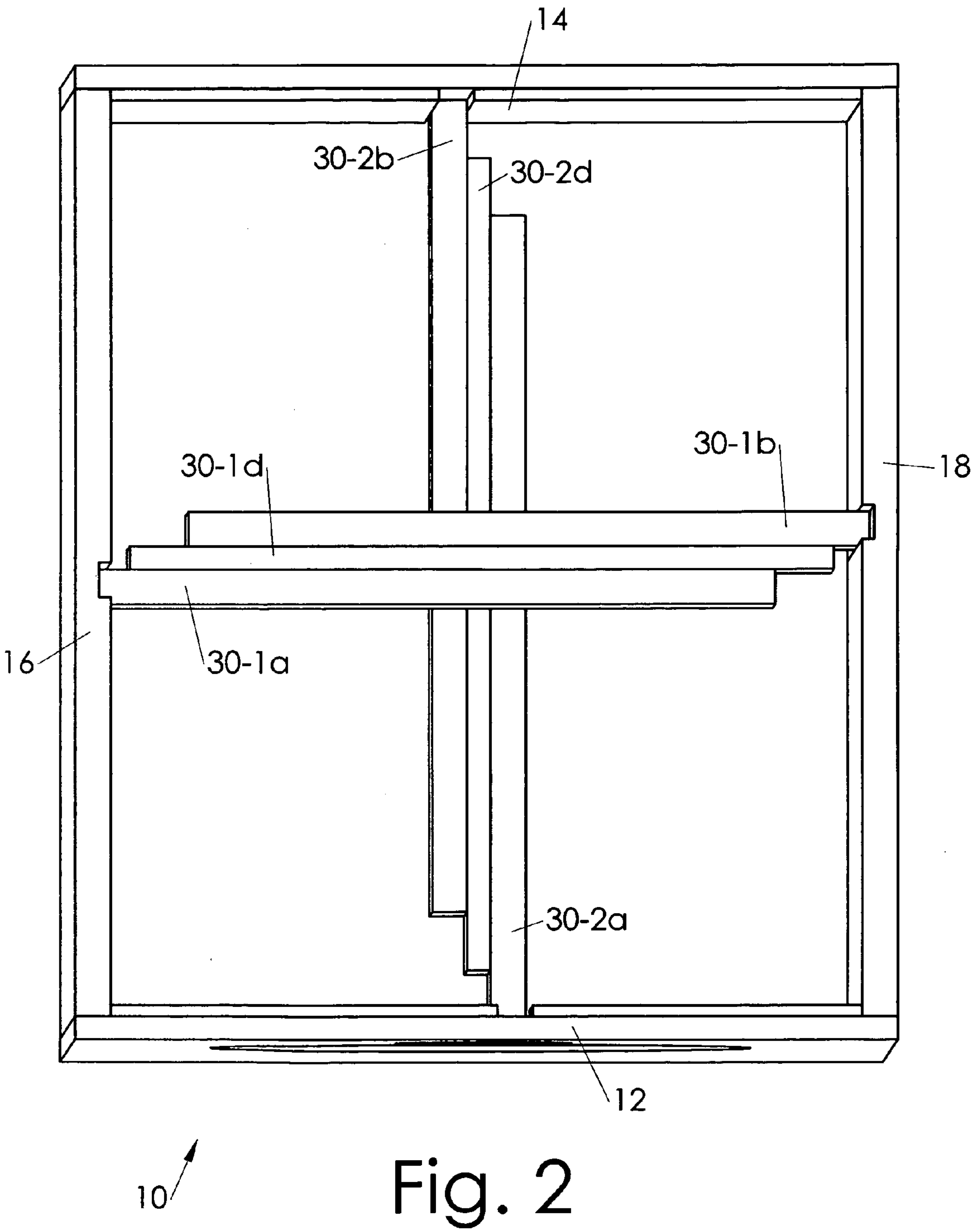
FIG. 2 is a top view of the cabinet of FIG. 1, with the top panel removed for visibility into the internal structures of the cabinet.

FIG. 2 is a top view of the cabinet 10 with the transducers and the top exterior panel removed. The first brace member 30-1*a* of the first brace 30-1 is coupled to the left exterior panel 16, the second brace member 30-1*b* is coupled to the right exterior panel 18, and the damping layer 30-1*d* is disposed in the region of overlap between the two panels. The second brace 30-2 is similarly coupled to the front and rear exterior panels.

The damping layer may extend beyond the floating ends of the brace members, as shown, or it may be trimmed even with them, or it may terminate prior to them. The amount of overlap between the first and second brace panels may be determined according to the various other parameters of the cabinet, such as the thickness and rigidity of the exterior panels, the volume of the enclosed air space, the power and size of the transducer, the panel resonant frequency which needs to be controlled, and the flexibility etc. of the damping material.

Figure 3:
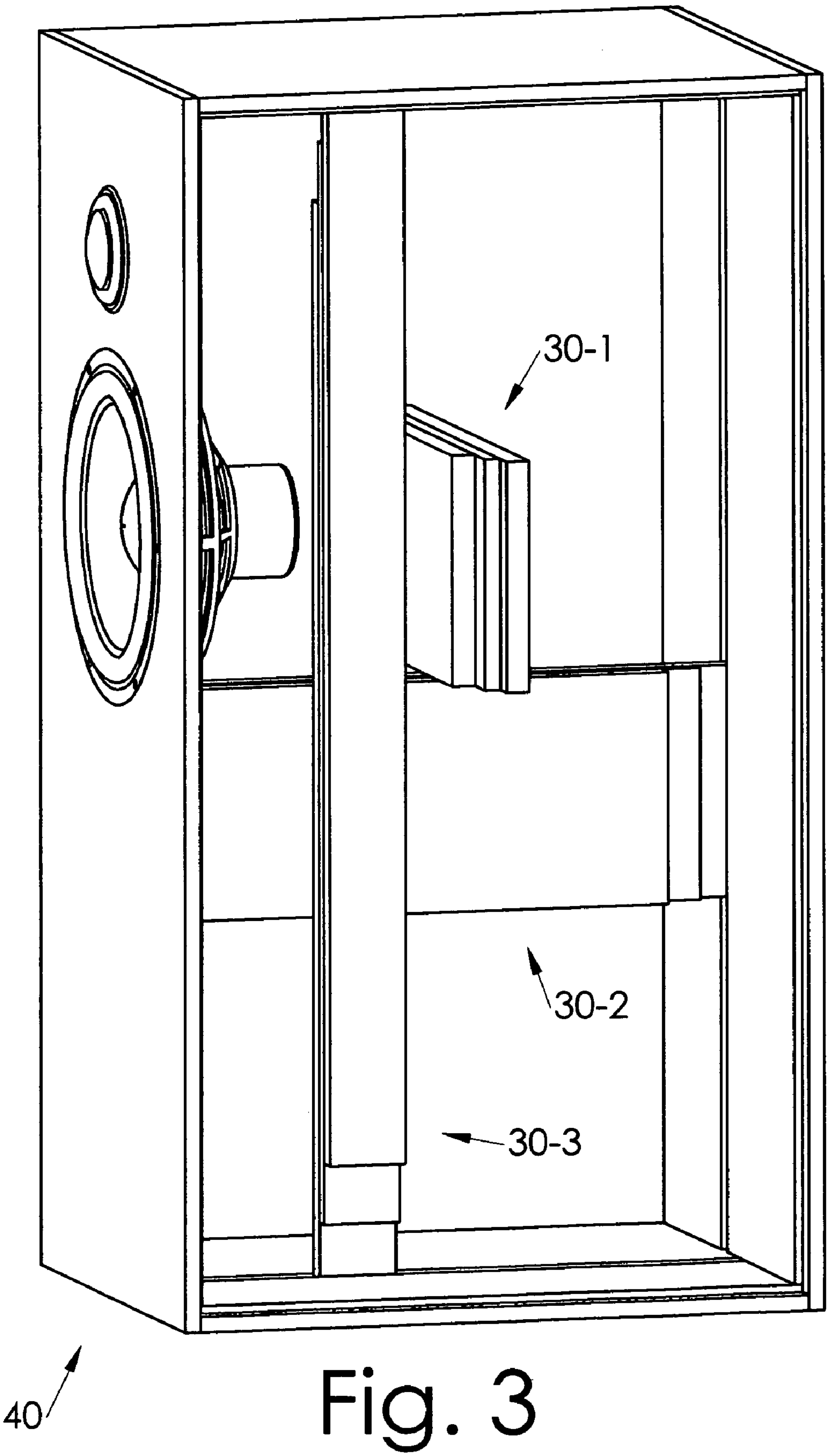
FIGS. 3-7 show different loudspeaker cabinets according to other embodiments of this invention, with different configurations of shear damping braces.

FIG. 3 illustrates a loudspeaker cabinet 40 including a first internal brace 30-1, a second internal brace 30-2, and a third internal brace 30-3, each coupling different opposing exterior panels.

In various embodiments, the cabinet may include different combinations of braces. There may be only a single brace coupling a first pair of exterior panels, or there may be two braces coupling two pairs of exterior panels, or there may be three braces coupling three pairs of exterior panels.

In some embodiments, there may be two or more braces coupling the same pair of exterior panels. In some embodiments, there may even be braces coupling non-opposing panels, in addition to or in lieu of braces coupling opposing panels. The braces may be oriented in a variety of different manners.

Figure 4:
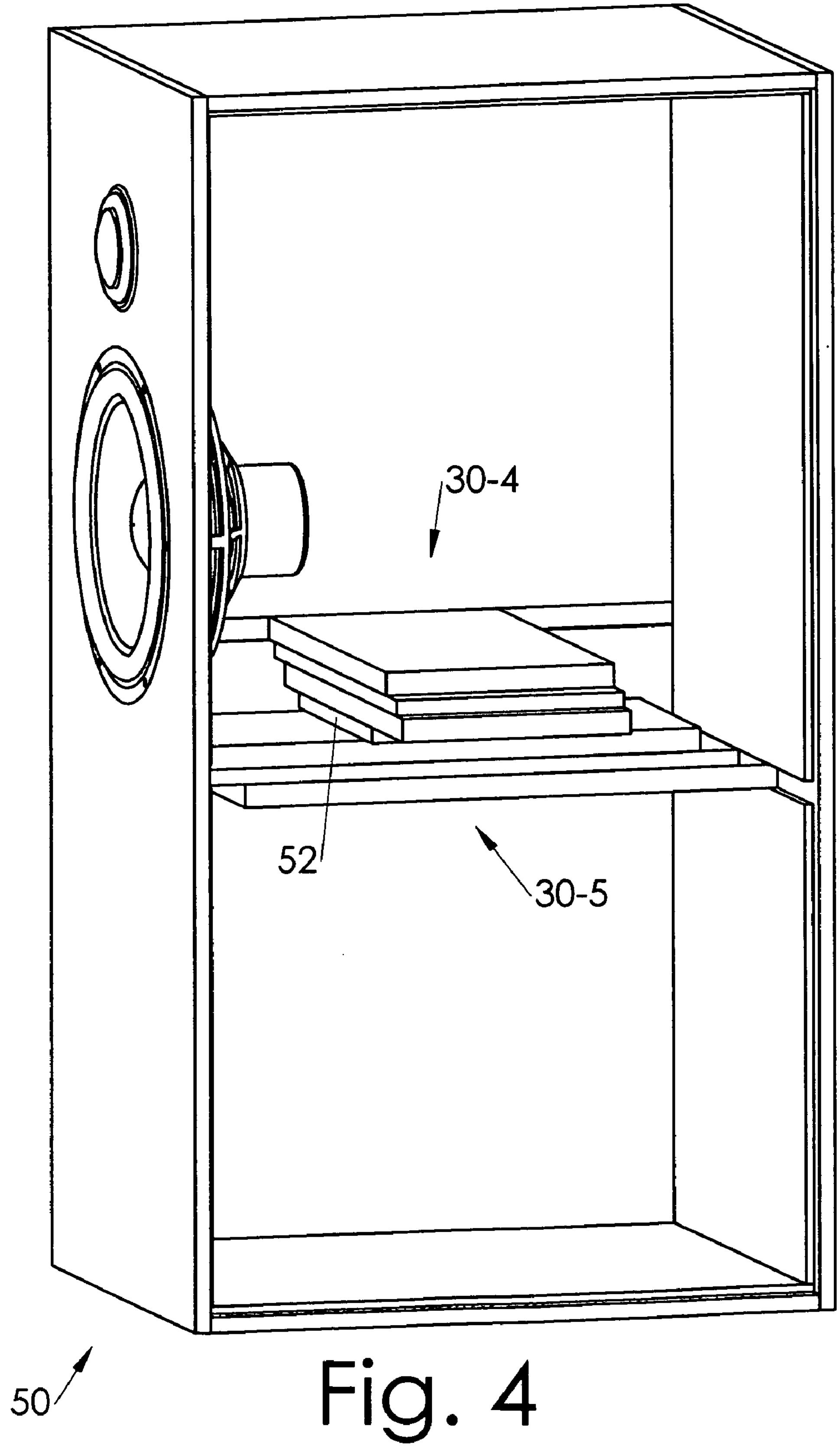

FIG. 4 illustrates a loudspeaker cabinet 50 in which the internal braces 30-4 and 30-5 are oriented parallel to the top and bottom of the enclosure, whereas in the previous drawings the braces were generally perpendicular to top and bottom of the enclosure. Optionally, a damping layer 52 is affixed between the adjacent brace members of the two braces for added absorption.

Figure 5:
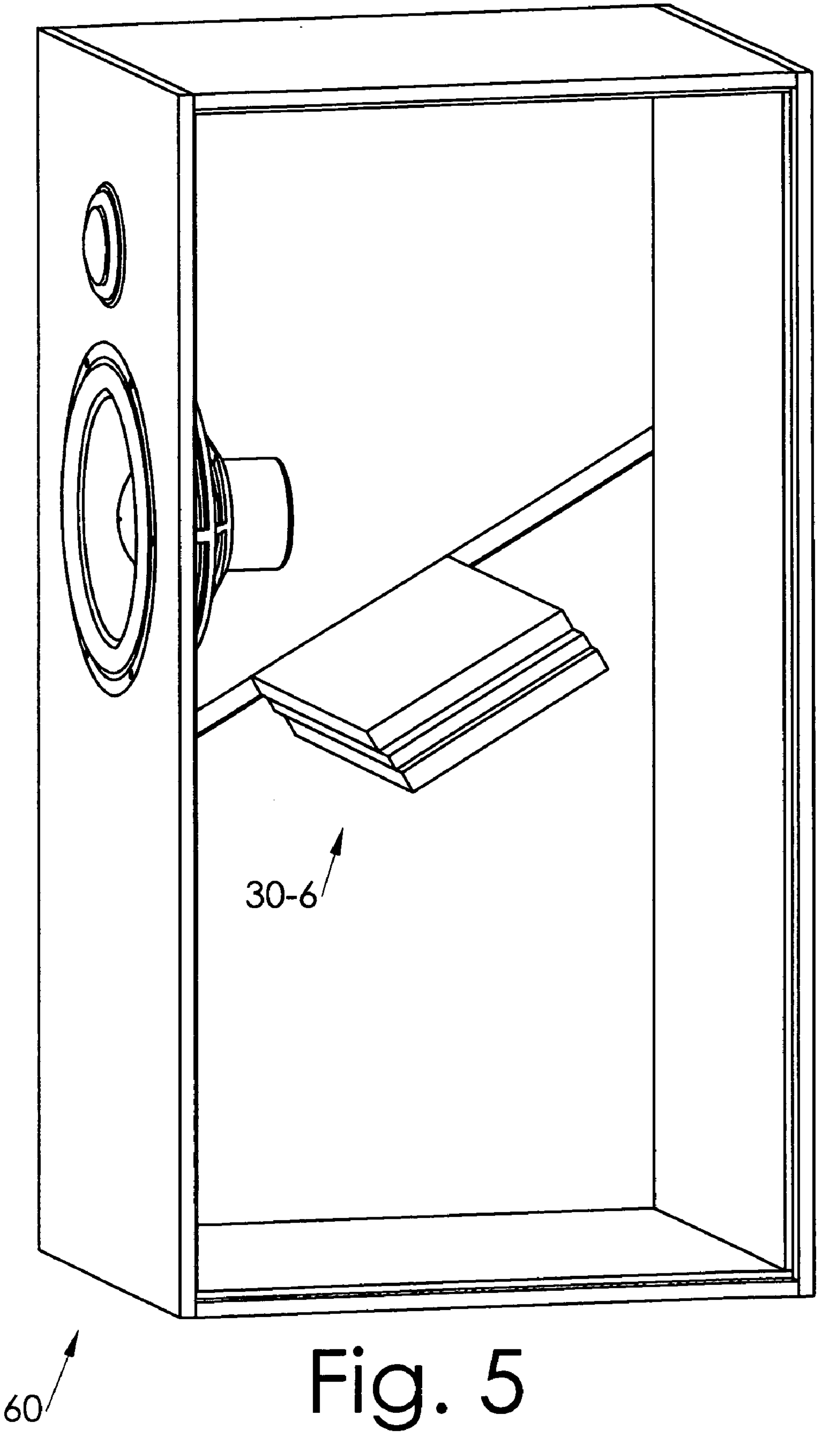

FIG. 5 illustrates a loudspeaker cabinet 60 in which a brace 30-6 is oriented at an angle with respect to the face of the transducer. Proper angle selection and brace placement with respect to the transducer can help reduce standing waves and other undesirable reflective effects within the enclosed air volume.

Figure 6:
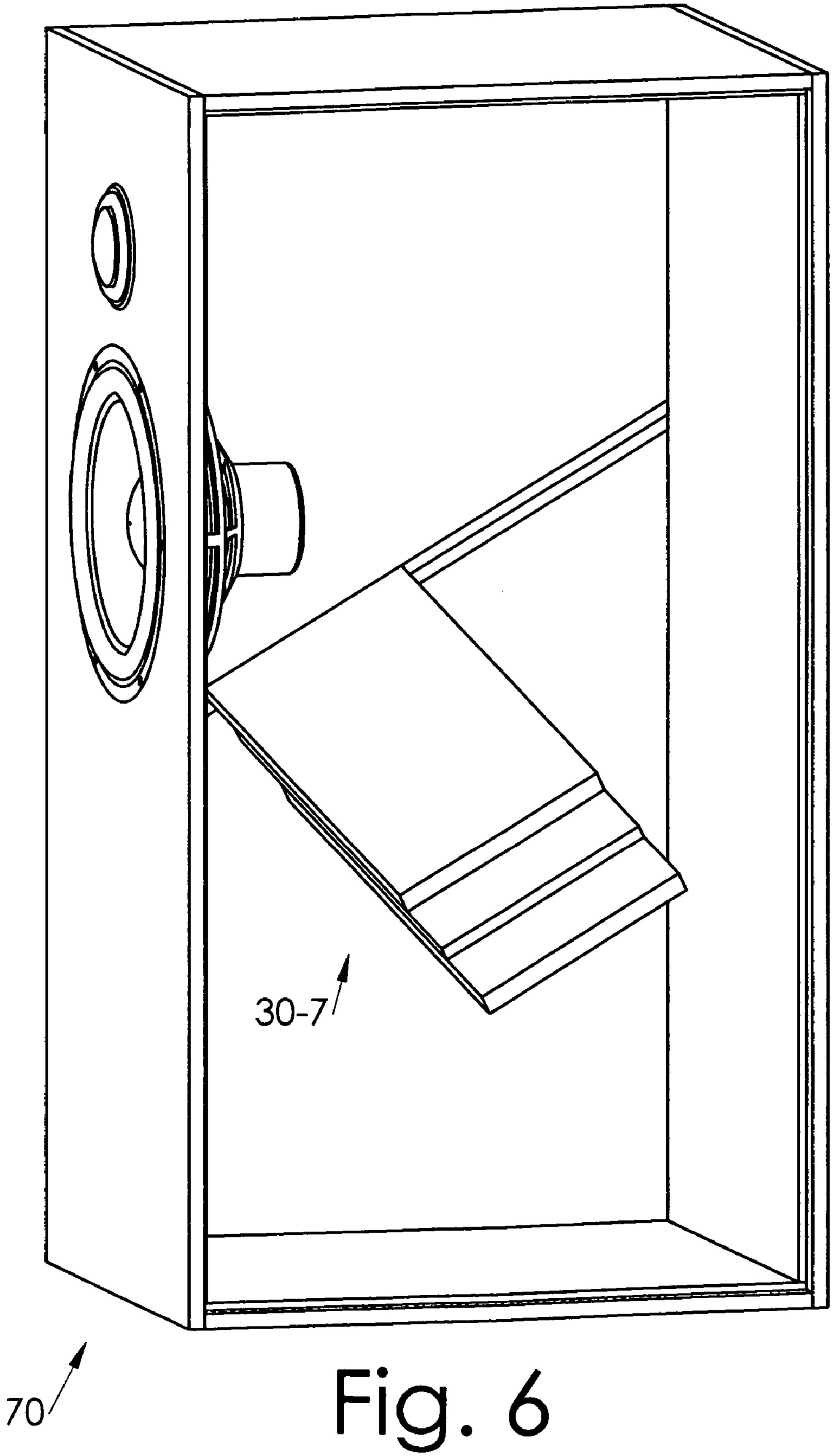

FIG. 6 illustrates a loudspeaker cabinet 70 in which the brace 30-7 is oriented at a compound angle.

Figure 7:
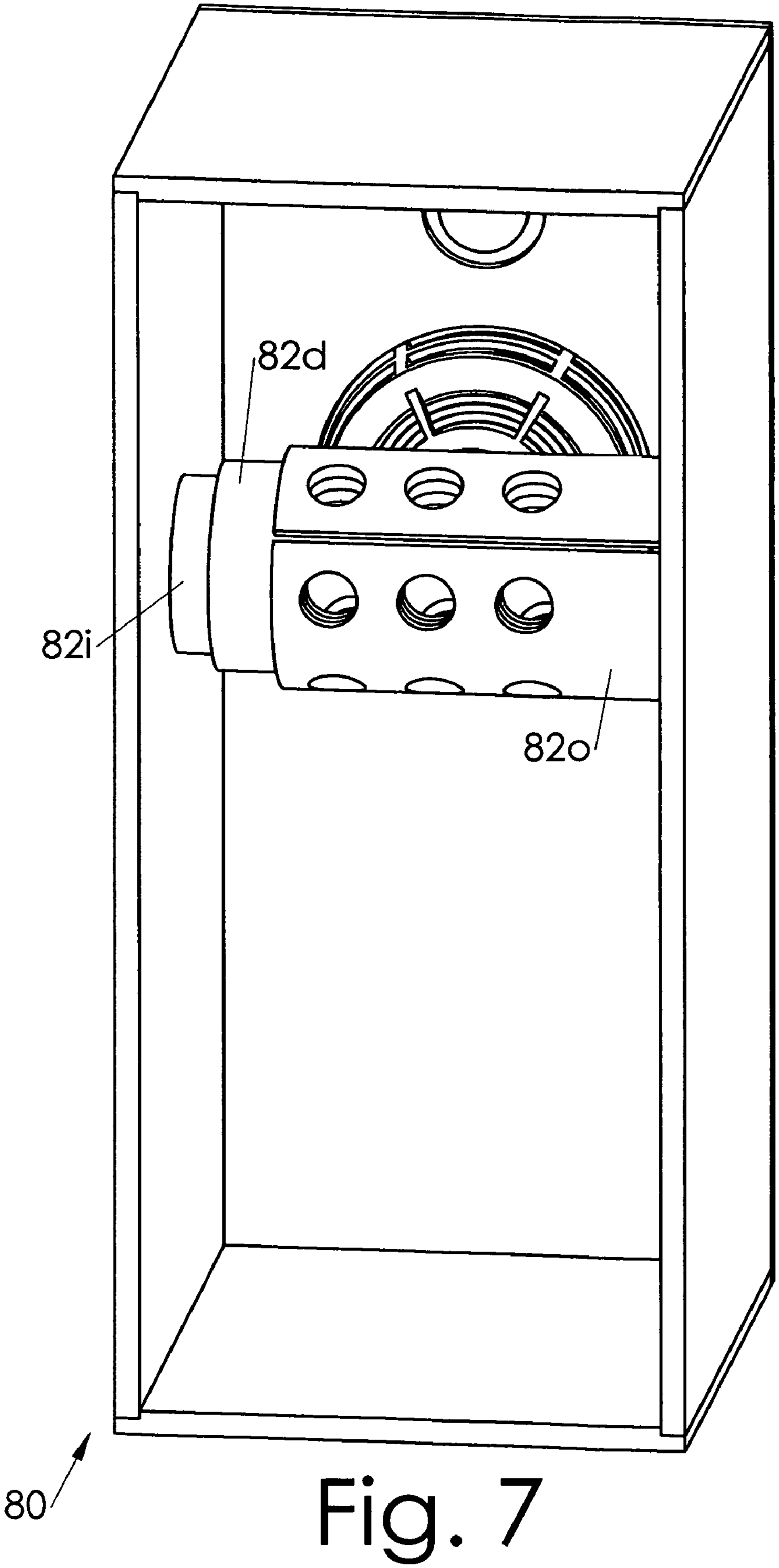

FIG. 7 illustrates a loudspeaker cabinet 80 which utilizes a non-planar shearing brace. The brace includes an outer tube 82*o* coupled to the left exterior panel (which appears on the right in this rear view), an inner tube 82*i* coupled to the right exterior panel, and a damping layer 82*d* sandwiched between and affixed to the tubes.

The tubes and the damping layer may be perforated with one or more holes, such that the internal volume of the inner tube is not subtracted from the effective air volume of the cabinet. The outer tube may be formed with a split, or may be formed as two semi-cylindrical halves, for ease of assembly.

Figure 8:
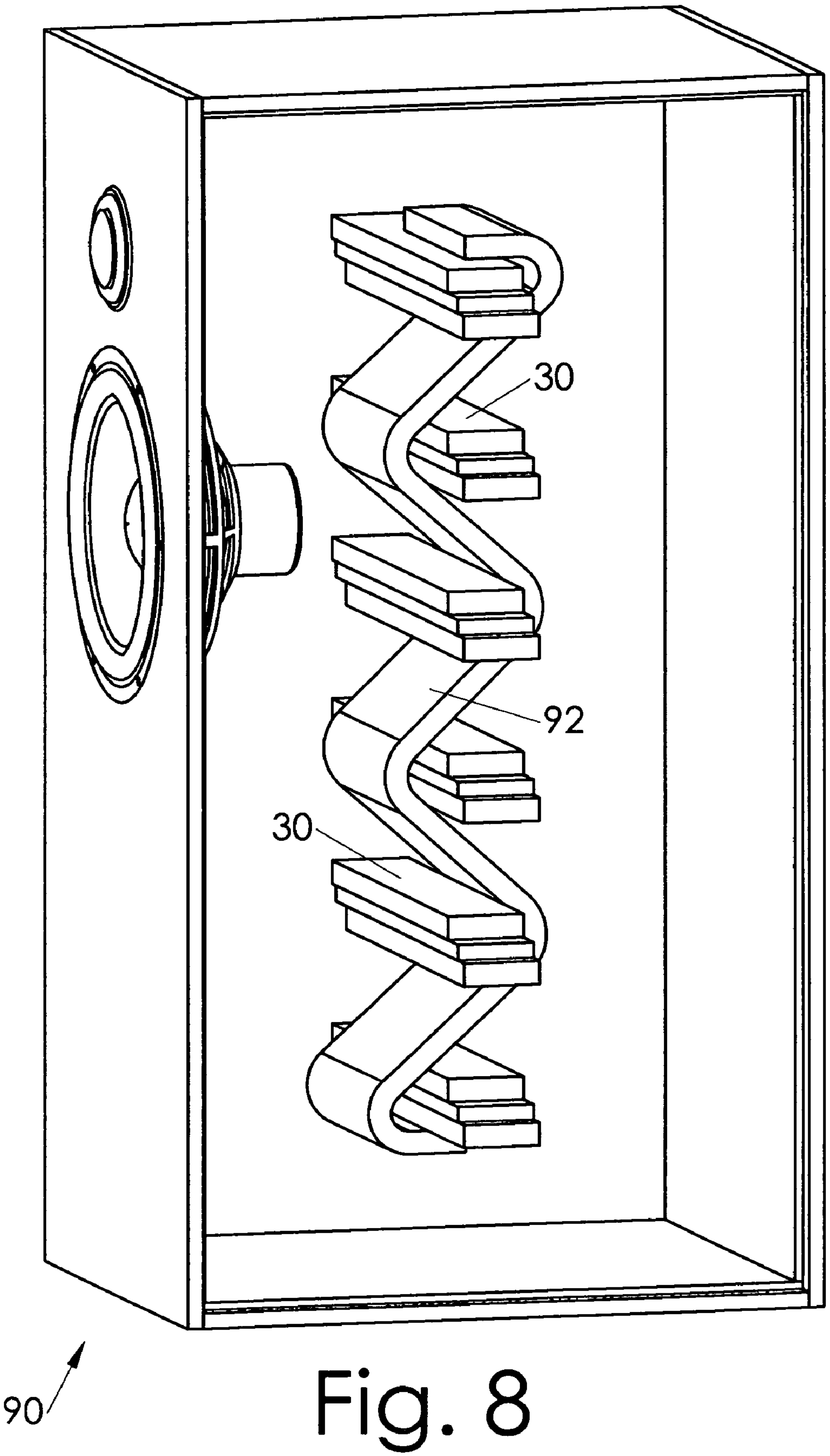
FIG. 8 shows a loudspeaker cabinet with a plurality of shear damping braces coupled between the same opposing pair of sides, and with the addition of batting.

FIG. 8 illustrates a loudspeaker cabinet 90 in which there are a plurality of shear damping braces 30 (e.g. 30-8, 30-9) coupling the same opposing pair of sides (one of which is not shown). A layer of batting material is coupled to the braces, which suspend it throughout a large portion of the internal volume. The batting is constructed of any suitable material, such as fiberglass insulation, and serves to deaden or damp internal standing waves traveling through the air volume, within the enclosure.

Figure 9:
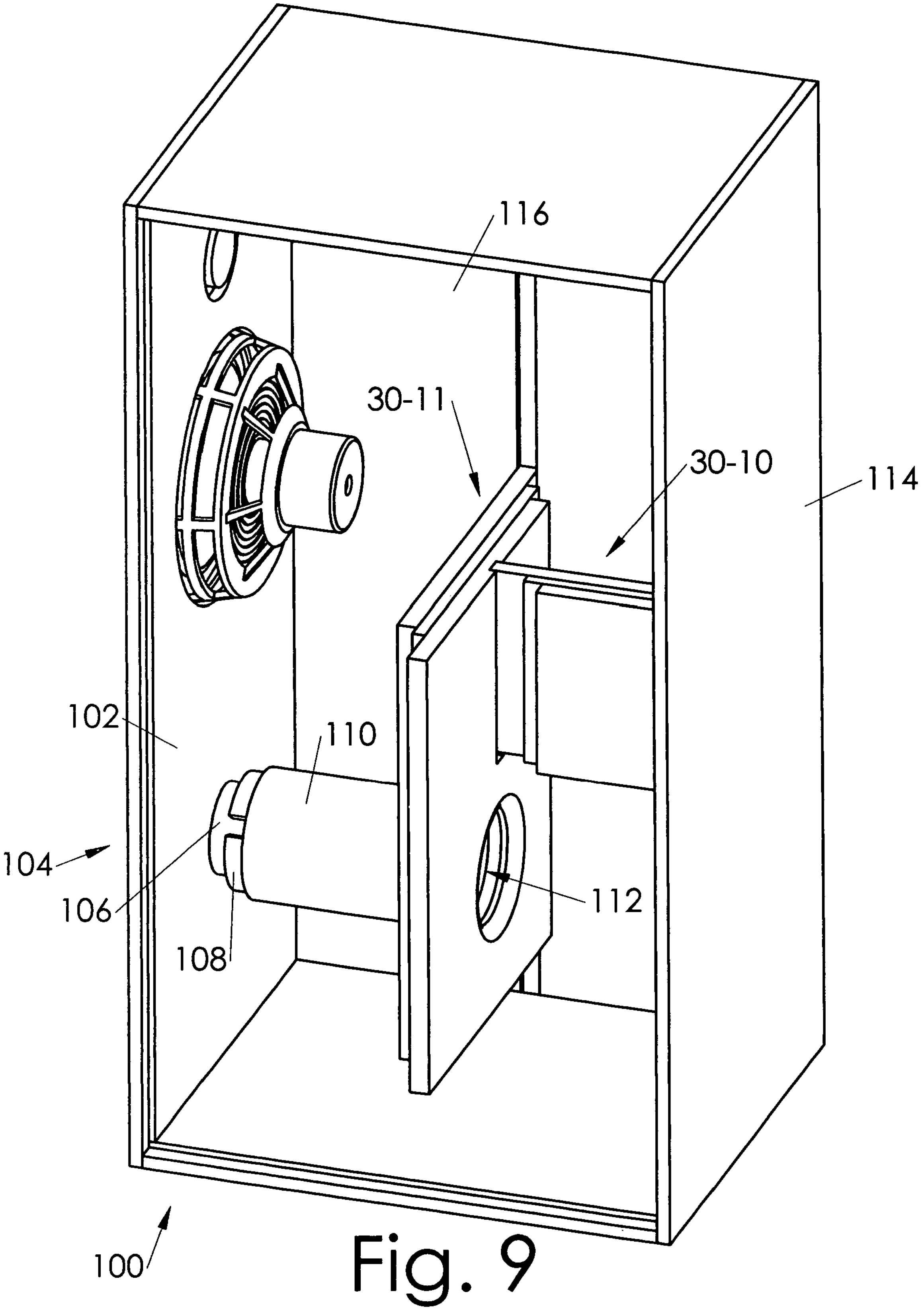
FIG. 9 shows a ported loudspeaker cabinet in which the port is constructed as a shear damper.

FIG. 9 illustrates a ported loudspeaker cabinet 100. The front panel includes a port opening (indicated by 104 but not visible) to which a port tube 106 is coupled. The port tube serves as an internal brace tube of a shearing brace which further includes a damping layer 108 and an outer brace tube 110. The outer brace tube is coupled to an internal brace which may itself comprise a shear brace 30-11. Another shear brace 30-10 may be coupled between the internal brace and an exterior panel.

The internal diameter and the length of the port tube will be selected according to the tuning needs of the cabinet at hand, and these will dictate the placement of the internal brace 30-11. Note that the internal brace 30-11 could be coupled to the outer tube 110 at any position along the length of the outer tube, and is not necessarily located at the extreme end of the tube, as is shown. Note further that the internal brace could be angled, to scatter or reduce standing waves.

Figure 10:
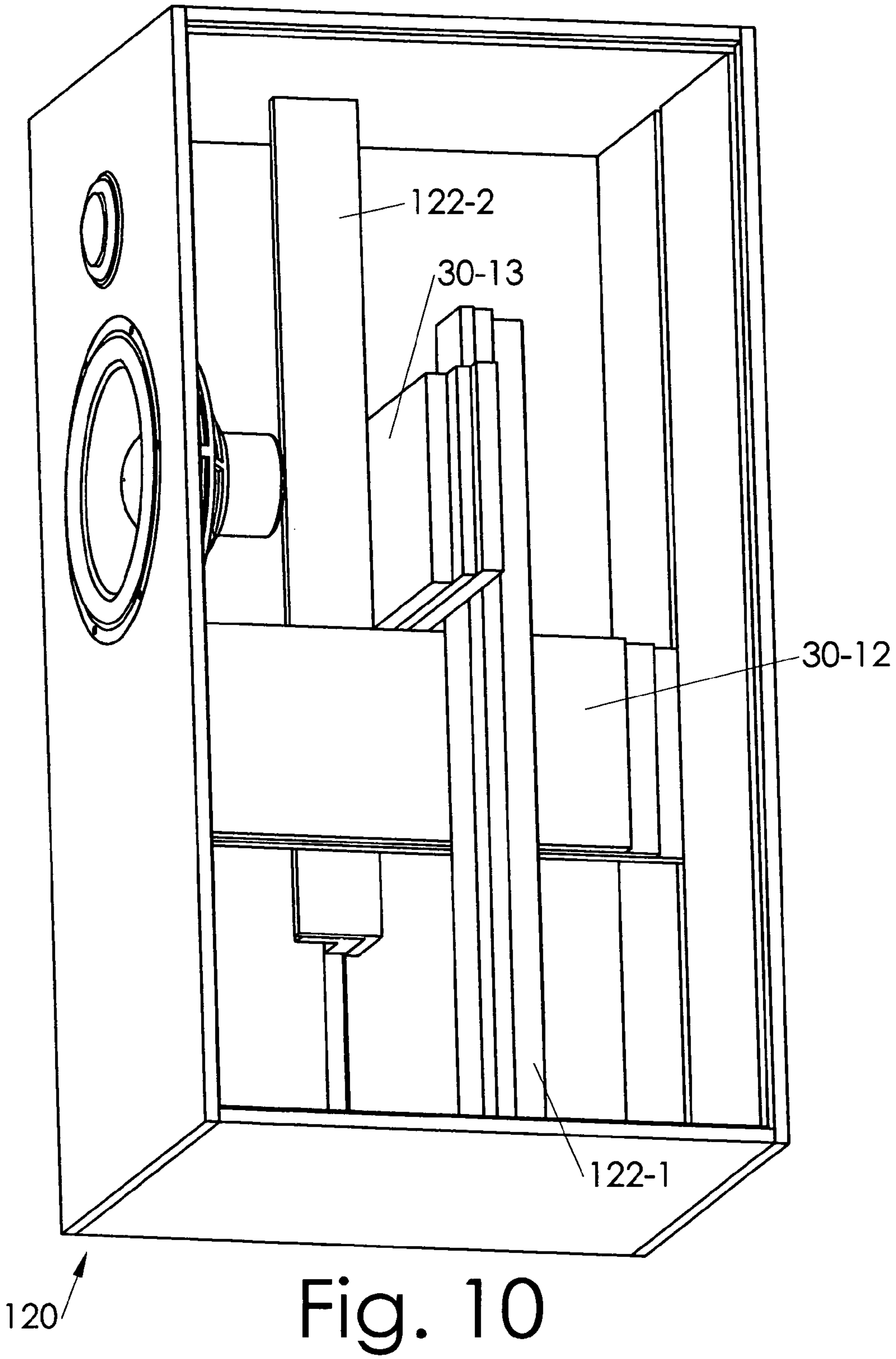
FIGS. 10 and 11 show a loudspeaker cabinet with shear damping couplers joining the shear damping braces.

FIG. 10 illustrates a loudspeaker cabinet 120 in which two shearing braces 30-12 and 30-13 are coupled together by perpendicular shearing braces 122-1 and 122-2. The first perpendicular shearing brace 122-1 is coupled to the bottom exterior panel, and the second is coupled to the top exterior panel.

Figure 11:
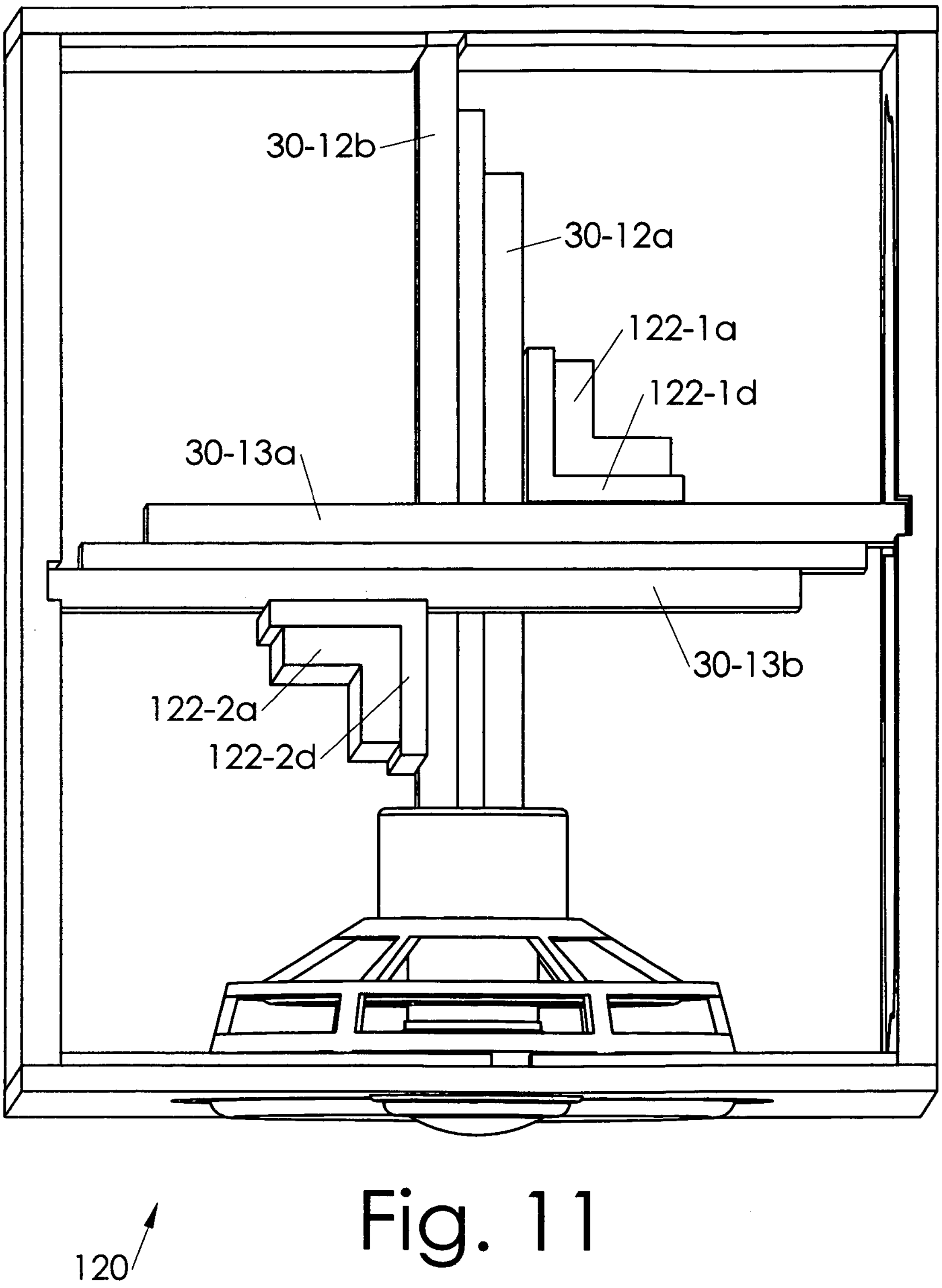

FIG. 11 illustrates the loudspeaker cabinet 120 in top view, with the top panel removed. The first perpendicular shearing brace includes a damping layer 122-1*d* which is coupled to a first brace member 30-12*a* of one of the shearing braces and to a first brace member 30-13*a* of the other shearing brace. The first perpendicular shearing brace also includes a brace member 122-1*a* which is coupled to the bottom panel 124. The perpendicular shearing brace does not necessarily include a second brace member, but instead may utilize the brace members of the braces to which it is coupled, to provide shearing of its damping layer.

Similarly, the second perpendicular shearing brace includes a damping layer 122-2*d* which is coupled to a second brace member 30-12*b* of the first shearing brace, and to a second brace member 30-13*b* of the second shearing brace. It further includes a brace member 122-2*a* which is coupled to the top exterior panel (not shown).

Figure 12:
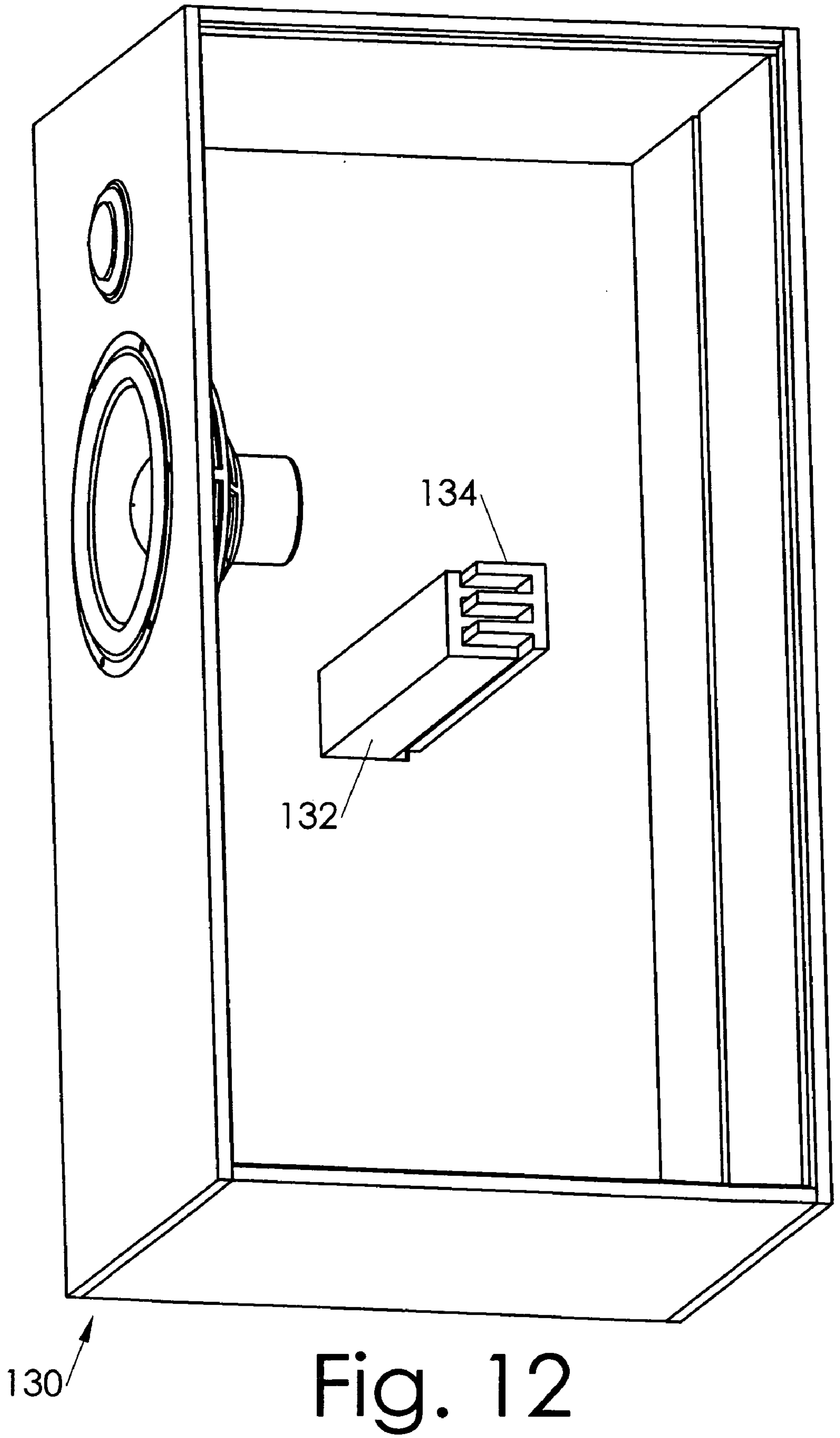
FIG. 12 shows a loudspeaker cabinet with a shear damping brace having interlaced fingers for greatly increased damping material surface area subject to shearing.

FIG. 12 illustrates a loudspeaker cabinet 130 including an internal shearing brace which includes elongated brace members 132, 134 having fingers. The first brace member 132 is coupled to the left exterior panel, and the second brace member 134 is coupled to the right exterior panel (not shown). The fingers of each brace member are interlaced with the fingers of the other brace member, greatly increasing the potential surface area where the damping material (not shown) can be applied. In this configuration, the damping material is preferably a flexible glue, which will be easier to assemble than e.g. trying to fold a sheet of damping material to fit into this convoluted path. The interlaced configuration offers a very high ratio between the damping material surface area and the total air volume displaced by the brace.

Figure 13:
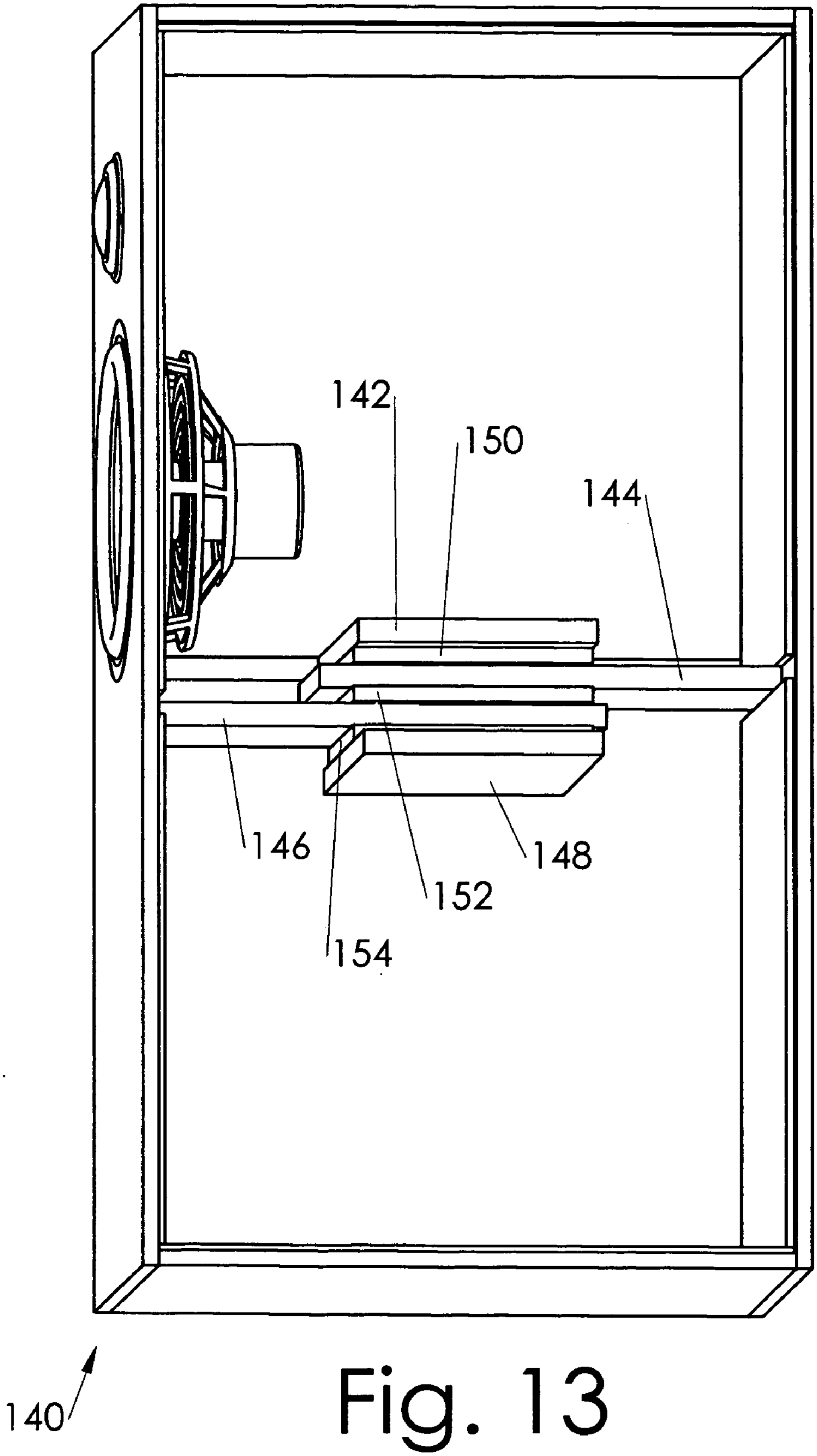
FIG. 13 shows a loudspeaker cabinet with a multi-wall shear damping brace structure.

FIG. 13 illustrates a loudspeaker cabinet 140 in which the shear damping brace is not necessarily coupled to, or only to, opposing exterior panels. A first brace member 142 is coupled to the left panel, a second brace member is coupled to the rear panel, and a first damping layer 150 is affixed between their overlapping sections.

Optionally, a third brace member 146 is coupled to the front panel, a fourth brace member 148 is coupled to the right panel (not shown), and a second damping layer 154 is affixed between their overlapping sections.

Optionally, a third damping layer 152 is affixed between overlapping sections of the second and third brace members. If the third brace member were to be below the fourth brace member, the third damping layer would be affixed between overlapping sections of the second and fourth brace members; in this configuration, no damping layer would be directly between brace members coupled to opposing exterior panels.

Figure 14:
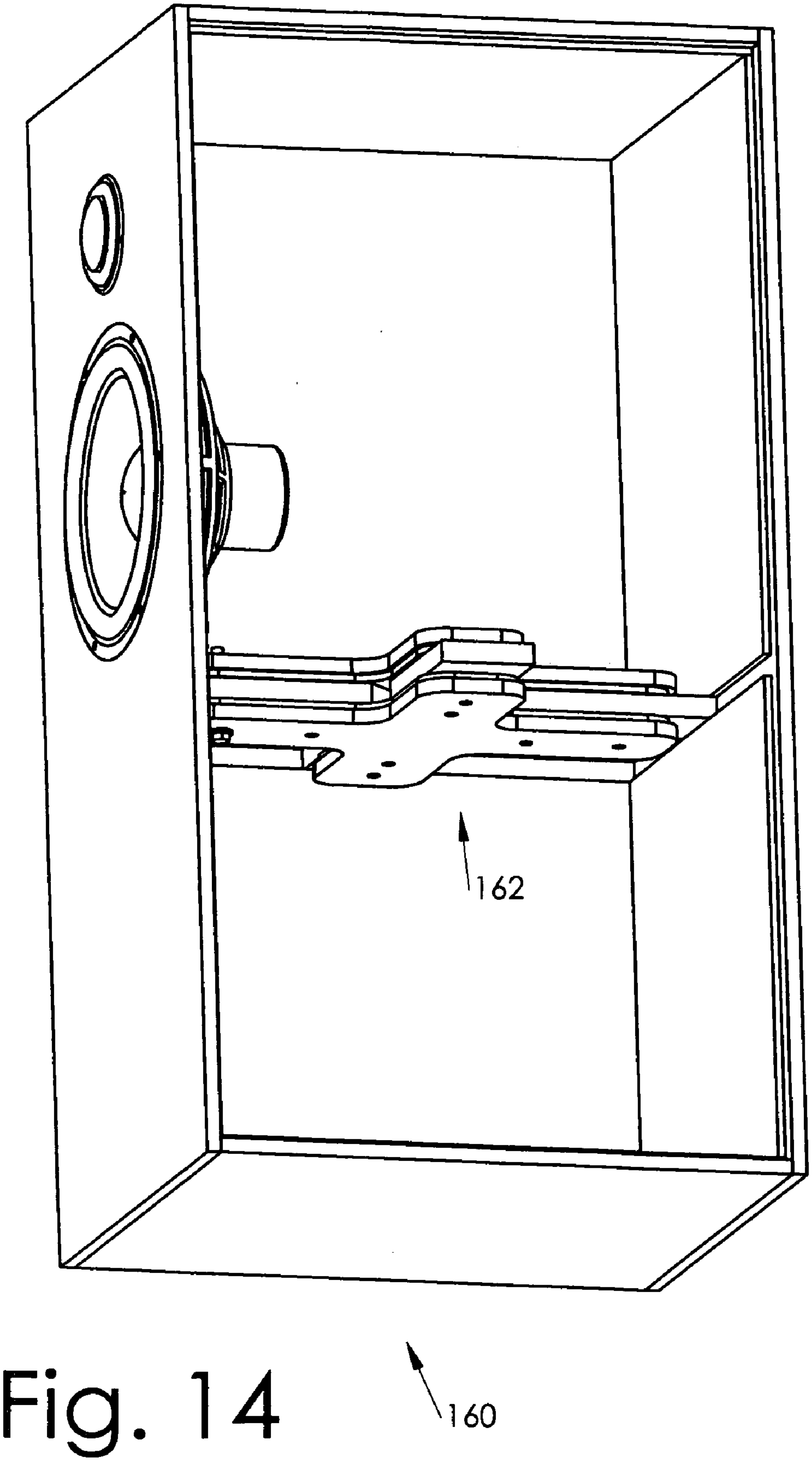
FIG. 14 shows a loudspeaker cabinet with a common member shearing brace.
Figure 15:
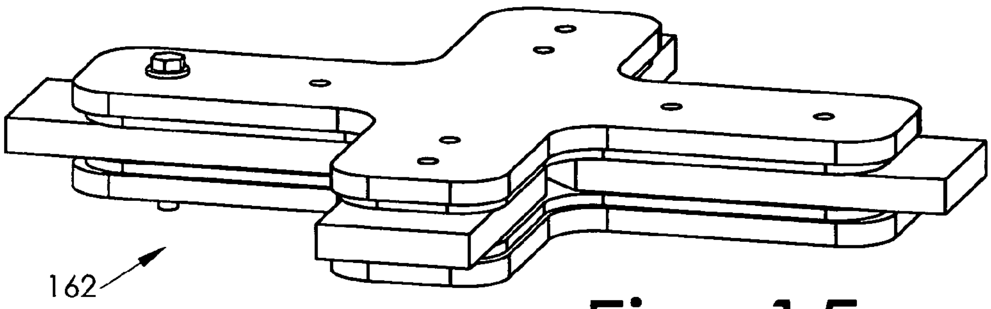
FIG. 15 shows the common member shearing brace of FIG. 14.
Figure 16:
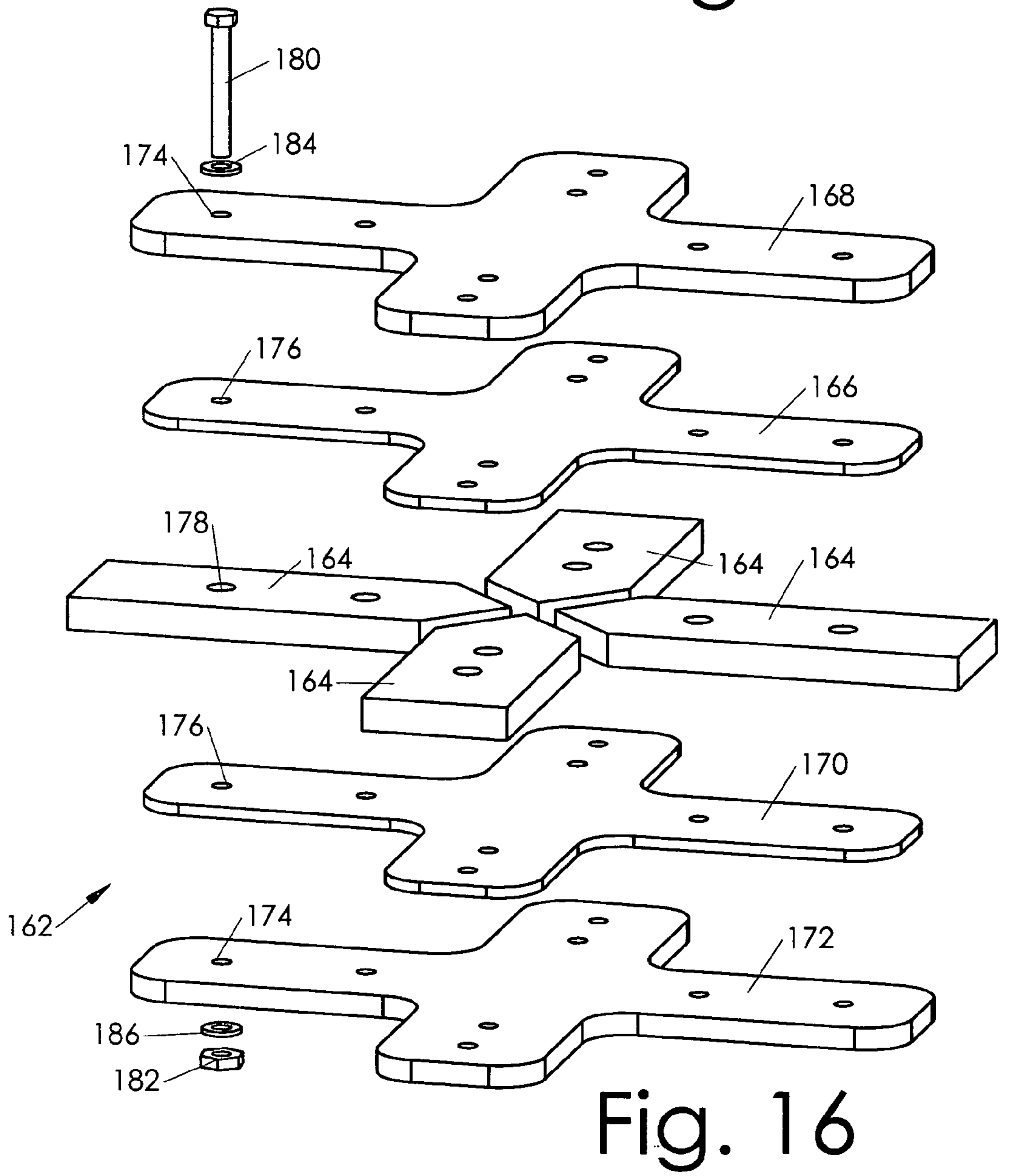
FIG. 16 shows the common member shearing brace of FIG. 15 in an exploded view.

FIG. 14 illustrates a loudspeaker cabinet 160 having a common member shearing brace 162. FIG. 15 illustrates the common member shearing brace 162, and FIG. 16 illustrates it in an exploded view. The reader may wish to refer to all three drawings. The brace includes two, or three, or preferably four panel brace members 164, each coupled to a respective exterior panel of the loudspeaker cabinet. In one embodiment, the panel brace members are substantially coplanar. A damping material member or layer 166 is laminated between those panel brace members and a common floating brace member 168. The common brace member is not coupled to the exterior panels, but floats. As an exterior panels moves and vibrates, its respective panel brace member moves and vibrates relative to the other panel brace members, causing shearing force to be applied to the portion of the damping layer which is laminated between the floating common brace member and that panel brace member. Unless the other panel brace members' exterior panels happen to be moving in the same vector (which is extremely unlikely), these other panel brace members will tend to hold the floating brace member relatively stationary, because there is more surface area of damping material laminated between them and the floating brace member, than between the floating brace member and the vibrating panel brace member.

Optionally, a second damping layer 170 is laminated between the opposite sides of the panel brace members and a second floating brace member 172.

Optionally, the floating brace members may be provided with a plurality of holes 174, and the panel brace members may be provided with one or more holes 178 aligned with the holes through the floating brace members, with corresponding holes 176 through the damping layer. Bolts 180 can be inserted through these holes, with nuts 182 and washers 184, 186, and then tightened. The holes 178 through the panel brace members should be made sufficiently large that the bolts free-float within them as the panel brace members vibrate and move, to avoid mechanically coupling the panel brace members to each other or to the floating brace members other than indirectly via the damping material. The tension on the bolts will affect the tuning of the floating brace system; in general, the tighter the floating braces are pinched onto the damping material, the higher the system's damping frequency will be.

Figure 17:
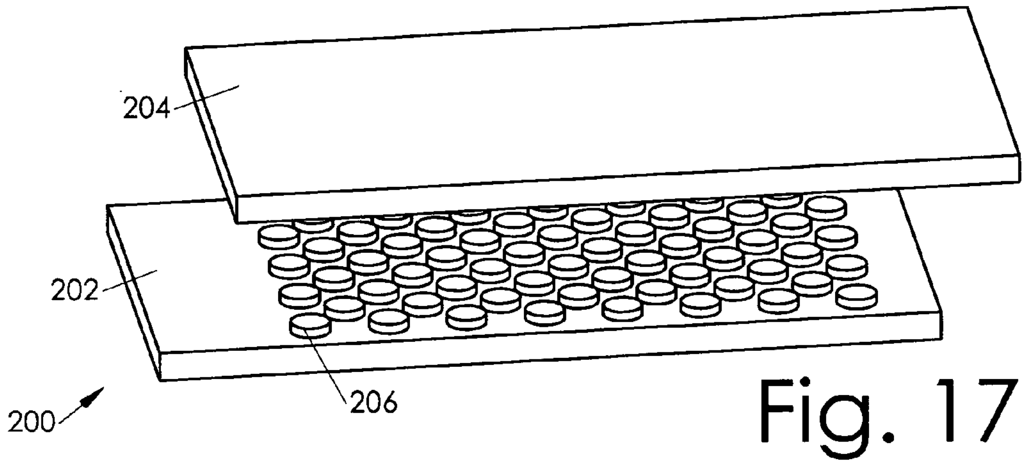
FIGS. 17-19 show embodiments of shearing braces in which the damping material is not a continuous sheet.

FIG. 17 illustrates a shearing brace 200 in which the damping material is not a continuous sheet. The shearing brace includes a first brace member 202 and a second brace member 204, between which are laminated a plurality of discontinuous pieces of damping material 206. In the embodiment illustrated, the damping layer is formed as a pattern of dots adhered to at least one of the damping members, and preferably to both. The damping layer may be formed by depositing the dots as an adhesive liquid onto the first damping member, allowing the dots to cure just enough that they do not run, affixing the first damping member to a panel of the cabinet (not shown), then affixing the second damping member to the opposite panel of the cabinet and in contact with the dots, such that the dots will fully cure and adhere to both brace members in a neutral position. Then, during operation of the loudspeaker, the dots will be subject to shearing force when either of the panels vibrates or flexes.

In some embodiments, the dots may be of a uniform size and pattern. In other embodiments, the dots may be of different sizes, and/or they may be in an irregular pattern or randomly placed.

Figure 18:
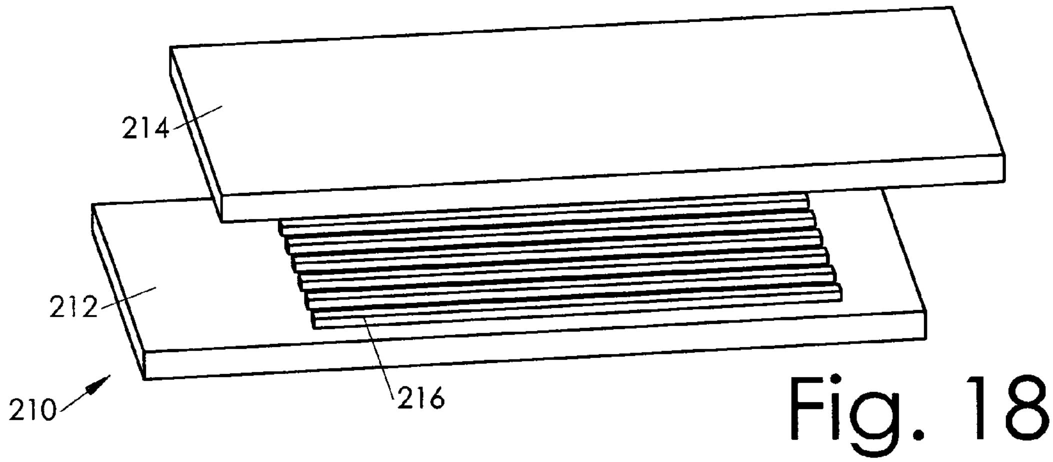

FIG. 18 illustrates a shearing brace 210 in which a discontinuous damping layer is adhered between a first brace member 212 and a second brace member 214. The damping layer includes a plurality of stripes 216 of damping material running generally in the direction of the primary, longitudinal movement of the brace members.

Figure 19:
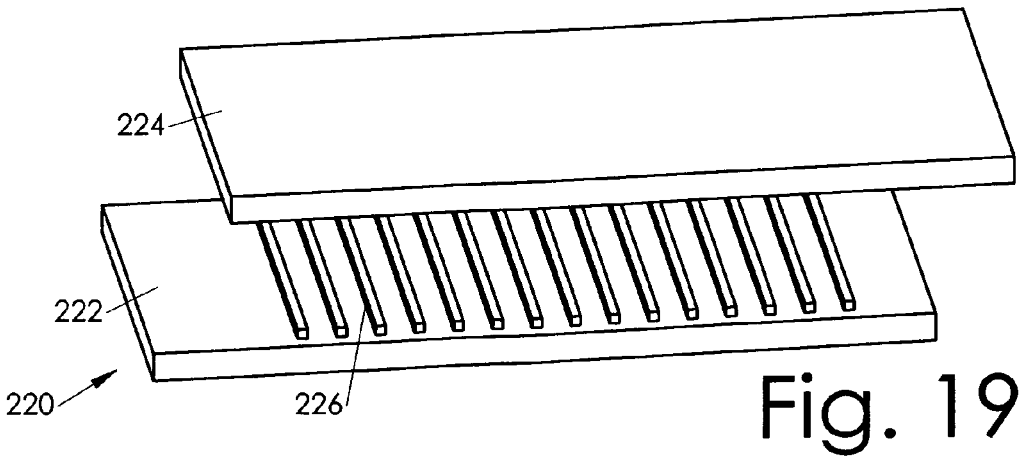

FIG. 19 illustrates a shearing brace 220 in which a discontinuous damping layer is adhered between a first brace member 222 and a second brace member 224. The damping layer includes a plurality of stripes 226 of damping material running generally perpendicular to the direction of primary, longitudinal movement of the brace members.

In other embodiments, there may be multiple groups of stripes extending in different directions, some longitudinal, some lateral, some diagonal, and so forth. It is not necessary that the stripes be strictly linear; in some embodiments, they may be curved, spiral, or randomly shaped.

Figure 20:
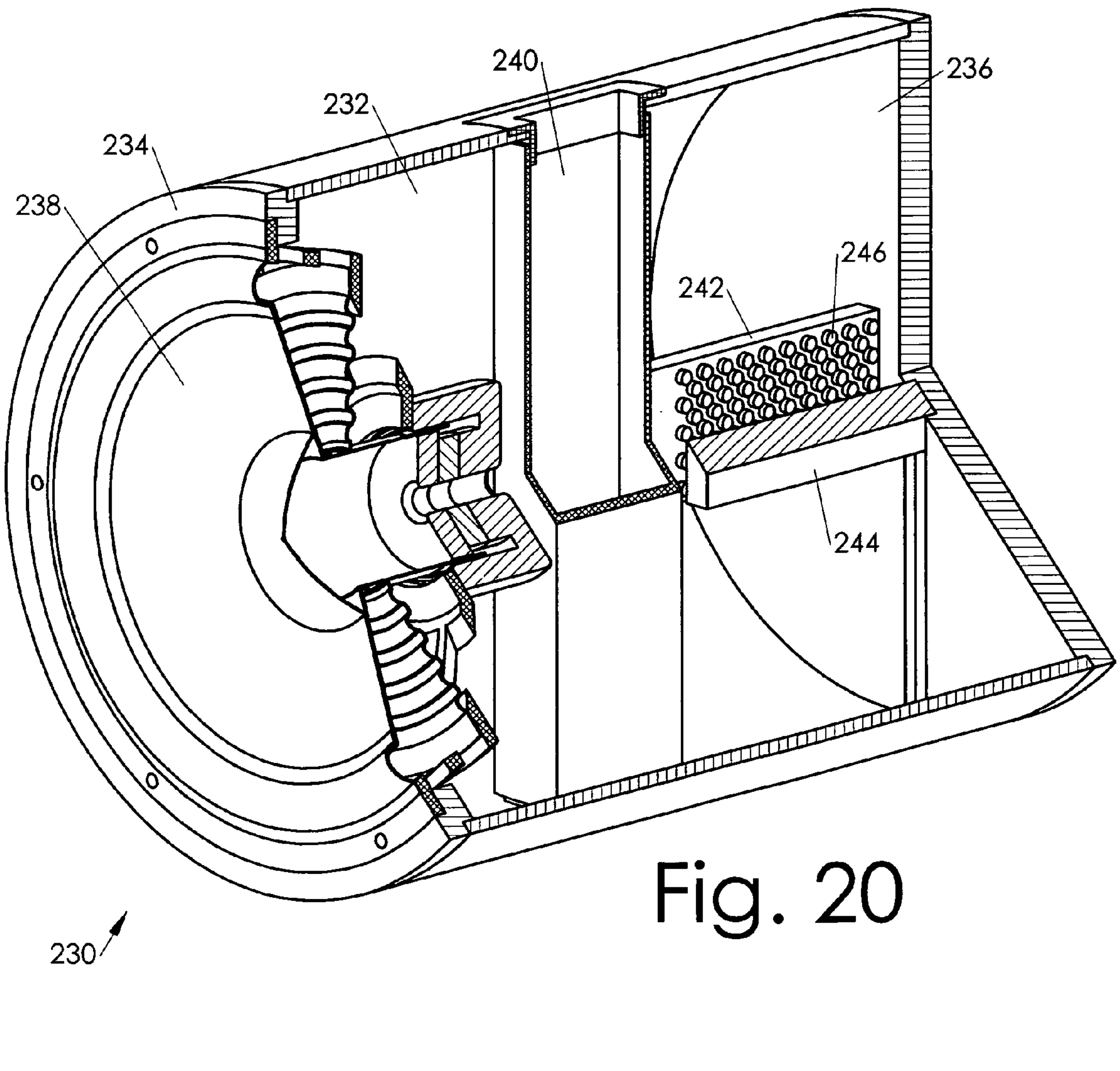
FIG. 20 shows a tubular loudspeaker cabinet having a shearing brace coupled between an end panel and a thermal chimney.

FIG. 20 illustrates a loudspeaker cabinet 230 which includes a tubular body 232 with a front panel 234 and a rear panel 236. The tubular body is, by the nature of its cylindrical shape, very rigid and not highly susceptible to flexure or vibration. However, the end panels of such cabinets are traditionally fashioned of substantially planar components, and are generally much more susceptible to flexure and vibration than is the tubular body. A transducer 238 is coupled to the front panel, and is typically nearly the diameter of the tubular body. Thus, there isn't much front panel to flex or vibrate. The rear panel is, thus, the cabinet part which is most in need of damping.

A support structure 240 extends across the inner dimension of the tubular body to support a first shear brace member 242. A second shear brace member is coupled to the rear panel, and a damping layer 246 is laminated between the first and second shear brace members. In one embodiment, the support structure can be fashioned as a thermal chimney, such as is disclosed in co-pending application Ser. No. 10/768,197 entitled "Thermal Chimney Equipped Audio Speaker Cabinet" filed Jan. 30, 2004, sharing an inventor with and commonly assigned with the present application.

Alternatively, the support structure can be omitted and the first shear brace member may be coupled to the back of the transducer motor or basket.

CONCLUSION

Armed with the teachings of this disclosure, the skilled cabinet designer will be able to select brace configurations, sizes, locations, angles, connections, materials, etc. according to the demands of the application at hand. The designer may, for example, wish to perform finite element analysis on the cabinet, to identify harmonic modes, rotational shear, panel flexure, and the like, and thereby determine where to place selected shear braces.

For ease of illustration, the invention has been shown in the figures in conventional rectilinear box configurations, but the invention may be practiced in a variety of cabinets having other shapes.

When one component is said to be "adjacent" another component, it should not be interpreted to mean that there is absolutely nothing between the two components, only that they are in the order indicated.

The various features illustrated in the figures may be combined in many ways, and should not be interpreted as though limited to the specific embodiments in which they were explained and shown.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

The term "panel" is not limited to flat, planar members. The terms "layer" and "laminated" are not limited to continuous sheets, but are intended to also cover e.g. a series of disjoint pieces such as the dots of FIG. 17 or the stripes of FIGS. 18-19.

What is claimed is:

1. A loudspeaker cabinet comprising:
a plurality of exterior panels enclosing an air volume; and
a first shearing brace disposed within the air volume and including,
a first brace member coupled to a first exterior panel,
a second brace member, and
a damping layer laminated between the first and second brace members.

2. The loudspeaker cabinet of claim 1 wherein:
the damping layer is affixed to one of the first and second brace members.

3. The loudspeaker cabinet of claim 2 wherein:
the damping layer is affixed to the first and second brace members.

4. The loudspeaker cabinet of claim 3 wherein:
the damping layer is adhesively affixed to the first and second brace members.

5. The loudspeaker cabinet of claim 1 wherein:
the first and second brace members comprise substantially planar panels.

6. The loudspeaker cabinet of claim 1 wherein:
the second brace member is coupled to a second exterior panel.

7. The loudspeaker cabinet of claim 6 wherein:
the damping layer extends at least 50% of a distance from the first exterior panel to the second exterior panel.

8. The loudspeaker cabinet of claim 6 wherein:
the damping layer extends at least 75% of a distance from the first exterior panel to the second exterior panel.

9. The loudspeaker cabinet of claim 6 wherein:
the damping layer extends at least 90% of a distance from the first exterior panel to the second exterior panel.

10. The loudspeaker cabinet of claim 1 wherein:
the second exterior panel is opposite the first exterior panel.

11. The loudspeaker cabinet of claim 1 further comprising:
a second brace including,
a third brace member coupled to a third exterior panel,
a fourth brace member coupled to a fourth exterior panel, and
a damping layer disposed between and in contact with the third and fourth brace members.

12. The loudspeaker cabinet of claim 11 further comprising:
a third brace including,
a fifth brace member coupled to a fifth exterior panel,
a sixth brace member coupled to a sixth exterior panel, and
a damping layer disposed between and in contact with the fifth and sixth brace members.

13. The loudspeaker cabinet of claim 1 wherein:
the brace is disposed within the loudspeaker cabinet at an angle not perpendicular to the first exterior panel.

14. The loudspeaker cabinet of claim 1 wherein the first shearing brace further comprises:
a third brace member coupled to a second exterior panel;
the damping layer is further laminated between the third brace member and the second brace member;
wherein the second brace member is floating.

15. The loudspeaker cabinet of claim 14 wherein the first shearing brace further comprises:

a fourth brace member coupled to a third exterior panel;

a fifth brace member coupled to a fourth exterior panel;

wherein the first, third, fourth, and fifth brace members are substantially coplanar; and the damping layer is further laminated between the fourth brace member and the second brace member, and between the fifth brace member and the second brace member.

16. The loudspeaker cabinet of claim 15 wherein the first shearing brace further comprises:

another floating brace member;

a second damping layer; and wherein the second damping layer is laminated between the other floating brace member and at least one of the first, third, fourth, and fifth brace members.

17. The loudspeaker cabinet of claim 16 wherein the first shearing brace further comprises:

means for tightening the floating brace members onto the damping layers.

18. The loudspeaker cabinet of claim 1 wherein:

the first brace member comprises a substantially cylindrical body coupled at one end to the first exterior panel;

the damping layer wraps around the cylindrical body; and the second brace member has a substantially tubular shape extending over the damping layer.

19. The loudspeaker cabinet of claim 18 wherein:

the first shearing brace comprises a port tube.

20. The loudspeaker cabinet of claim 19 further comprising:

a substantially planar shearing brace coupled to a second exterior panel and supporting the port tube.

21. The loudspeaker cabinet of claim 1 wherein the damping layer comprises:

a discontinuous plurality of damping material members.

22. The loudspeaker cabinet of claim 21 wherein the damping layer comprises:

a plurality of dots.

23. The loudspeaker cabinet of claim 21 wherein the damping layer comprises;

a plurality of stripes.

24. A loudspeaker cabinet comprising:

a plurality of exterior panels enclosing an air volume;

at least one electromagnetic transducer coupled to one of the exterior panels so as to have a front diaphragm surface exposed to a listening ambient and a rear diaphragm surface exposed to the enclosed air volume; and at least one laminated brace each coupled between a respective opposing pair of the exterior panels, wherein the laminated brace includes, a first brace member coupled to a first exterior panel of the pair but not to a second exterior panel of the pair, a second brace member coupled to the second exterior panel of the pair but not to the first exterior panel of the pair, the first and second brace members overlapping in an overlap region, and a layer of damping material disposed between and affixed to the first and second brace members in the overlap region.

25. The loudspeaker cabinet of claim 24 further comprising:

a plurality of such laminated braces.

26. The loudspeaker cabinet of claim 24 wherein:

the first and second brace members are substantially planar panels.

27. The loudspeaker cabinet of claim 26 wherein:

the laminated brace is oriented within the loudspeaker cabinet at an angle between 10 and 80 degrees from normal to an axis of the electromagnetic transducer in a first direction.

28. The loudspeaker cabinet of claim 27 wherein:

the angle is a compound angle.

29. An improvement in a loudspeaker cabinet, the loudspeaker cabinet including a plurality of exterior panels coupled together to enclose a volume of air, and an electroacoustic transducer coupled to one of the exterior panels such that a rear surface of a diaphragm of the transducer is in contact with the enclosed air volume, wherein the improvement comprises:

at least one internal brace including, a first brace panel coupled to a first one of the exterior panels, a second brace panel overlapping the first brace panel in an overlap region, and a layer of damping material disposed between and affixed to the first and second brace panels in the overlap region;

whereby flexure and vibration of the first exterior panel are damped by shearing force in the layer of damping material.

30. The improvement of claim 29 in the loudspeaker cabinet, wherein the improvement further comprises:

a plurality of such internal braces each coupled to a respective pair of the exterior panels.

31. The improvement of claim 29 in the loudspeaker cabinet, wherein the improvement further comprises:

the internal brace further including a plurality of first brace panels coupled to respective ones of the exterior panels;

the second brace panel overlapping each of the first brace panels in a respective overlap region; and the layer of damping material being disposed between and affixed to the second brace panel and each of the first brace panels in the respective overlap regions;

wherein the second brace panel floats, suspended by the layer of damping material.

32. The improvement of claim 31 in the loudspeaker cabinet, wherein the improvement further comprises:

the internal brace further including a second layer of damping material and another second brace panel, the second layer of damping material being laminated between the other second brace panel and the plurality of first brace panels.

33. The improvement of claim 29 in the loudspeaker cabinet, wherein the improvement further comprises:

the second brace panel being coupled to a second one of the exterior panels which is opposite the first one.

* * * * *